(12) United States Patent  
Quach et al.

(10) Patent No.: US 7,049,612 B2  
(45) Date of Patent: May 23, 2006

(54) ELECTRON BEAM TREATMENT APPARATUS

(75) Inventors: David H. Quach, San Jose, CA (US); Jun Zhao, Cupertino, CA (US)

(73) Assignee: Applied Materials, Santa Clara, CA (US)

(*) Notice: Subject to any disclaimer, the term of this patent is extended or adjusted under 35 U.S.C. 154(b) by 248 days.

(21) Appl. No.: 10/792,053

(22) Filed: Mar. 2, 2004

(65) Prior Publication Data

US 2005/0194548 A1    Sep. 8, 2005

(51) Int. Cl.
G21K 5/02 (2006.01)
H01L 21/336 (2006.01)

(52) U.S. Cl. .............. 250/492.3; 250/492.23; 250/389; 438/798; 438/787; 438/473; 438/638

(58) Field of Classification Search .............. 250/492.3
See application file for complete search history.

(56) References Cited

U.S. PATENT DOCUMENTS

| | | | |
|---|---|---|---|
| 5,003,178 A | | 3/1991 | Livesay .................. 250/492.3 |
| 6,132,814 A | * | 10/2000 | Livesay et al. ............. 438/787 |
| 6,407,399 B1 | | 6/2002 | Livesay .................. 250/492.3 |
| 6,607,991 B1 | * | 8/2003 | Livesay et al. ............. 438/787 |
| 6,831,284 B1 | * | 12/2004 | Demos et al. ........... 250/492.3 |
| 2003/0038251 A1 | * | 2/2003 | Livesay et al. .......... 250/492.3 |
| 2004/0266123 A1 | * | 12/2004 | Cui et al. .................... 438/305 |

FOREIGN PATENT DOCUMENTS

WO    WO 9636070    * 11/1996

* cited by examiner

*Primary Examiner*—Nikita Wells
*Assistant Examiner*—James J. Leybournt
(74) *Attorney, Agent, or Firm*—Janah and Associates

(57) ABSTRACT

One embodiment of the present invention is an electron beam treatment apparatus that includes: (a) an array of lamps that output radiation; (b) a support mechanism adapted to support a substrate at a treatment position above the lamps; and (c) a lamp heat shield, disposed above the array, having a radiation absorption portion adapted to absorb radiation from at least a portion of the array, and a radiation reflection portion adapted to reflect radiation from at least a portion of the array towards the substrate when disposed at the treatment position.

12 Claims, 5 Drawing Sheets

ELECTRON BEAM TREATMENT APPARATUS

TECHNICAL FIELD OF THE INVENTION

One or more embodiments of the present invention pertain to apparatus for electron beam treatment used to fabricate integrated circuit devices.

BACKGROUND OF THE INVENTION

Fabrication of integrated devices, for example, and without limitation, semiconductor integrated devices, is complicated and, due to increasingly stringent requirements on device designs due to demands for greater device speed, fabrication is becoming ever more complicated. For example, integrated circuit geometries have decreased in size substantially since such devices were first introduced several decades ago. Since then, integrated circuits have generally followed a two year/half-size rule (often called Moore's Law), which means that the number of devices on a chip doubles every two years. Today's fabrication facilities are routinely producing devices having 0.13 µm feature sizes, and tomorrow's facilities soon will be producing devices having even smaller feature sizes. In addition, integrated circuits are being layered or stacked with ever decreasing insulating thickness between each circuitry layer.

In the production of advanced integrated circuits that have minimum feature sizes of 0.13 µm and below, problems of RC delay, power consumption, and crosstalk become significant. For example, device speed is limited in part by the RC delay which is determined by the resistance of metals used in the interconnect scheme, and the dielectric constant of insulating dielectric material used between metal interconnects. In addition, with decreasing geometries and device sizes, the semiconductor industry has sought to avoid parasitic capacitance and crosstalk noise caused by inadequate insulating layers in the integrated circuits. One way to achieve the desired low RC delay and higher performance in integrated circuit devices involves the use of dielectric materials in the insulating layers that have a low dielectric constant (k).

As the required value for the dielectric constant of materials is decreased due to device performance demands, there are many different types of low-k materials that are being investigated to determine whether they can perform acceptably. Most of these candidates are porous materials that can be organic materials, inorganic materials, organic compositions that might include inorganic components, and so forth. Further, ongoing investigations are exploring electron beam treatment of such films to improve their properties and/or to lower their dielectric constant. For example, such electron beam treatment can lower the dielectric constant and improve mechanical properties.

As used herein, the term electron beam or e-beam treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

In order to utilize such an electron beam treatment apparatus in production, it is important to provide reasonable temperature uniformity over a wafer or substrate during treatment to ensure process uniformity. Process uniformity is important for, among other things, improving device yields of electron beam treated films. Temperature uniformity across a wafer or substrate during treatment using a prior art electron beam treatment apparatus is about ±10° C., and this is problematic in terms of process uniformity.

In light of the above, there is a need to overcome one or more of the above-identified problems.

SUMMARY OF THE INVENTION

One or more embodiments of the present invention advantageously overcome one or more of the above-identified problems. In particular, one embodiment of the present invention is an electron beam treatment apparatus that includes: (a) an array of lamps that output radiation; (b) a support mechanism adapted to support a substrate at a treatment position above the lamps; and (c) a lamp heat shield, disposed above the array, having a radiation absorption portion adapted to absorb radiation from at least a portion of the array, and a radiation reflection portion adapted to reflect radiation from at least a portion of the array towards the substrate when disposed at the treatment position.

DETAILED DESCRIPTION

Advantageously, one or more embodiments of the present invention provide an electron beam treatment apparatus that provides less than about 8° C. max/min temperature uniformity during electron beam treatment across a 300 mm wafer or substrate at a wafer or substrate set point temperature of about 400° C.

Figure 1:
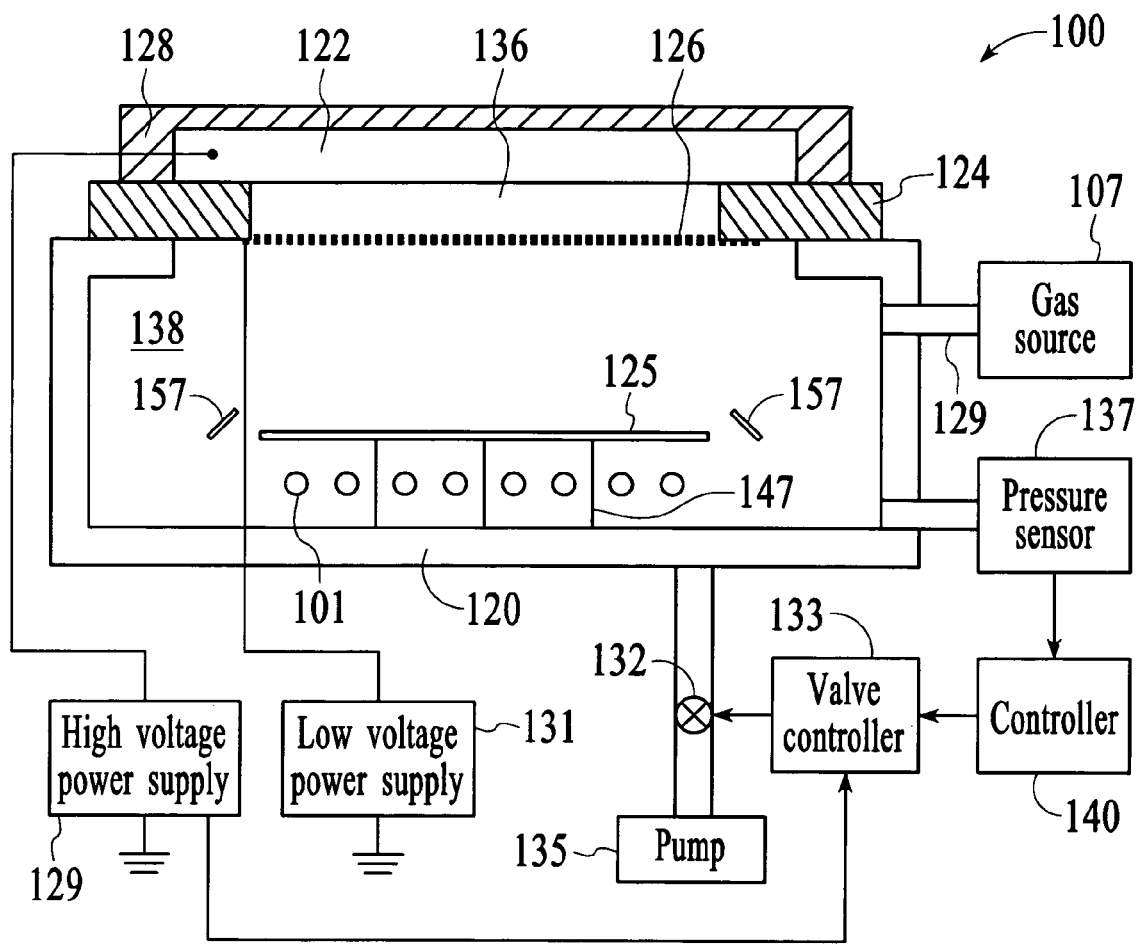
FIG. 1 shows a schematic diagram of a partial cross sectional view of an electron beam treatment apparatus that is fabricated in accordance with one or more embodiments of the present invention.

FIG. 1 shows a schematic diagram of a partial cross sectional view of large area electron beam source, electron beam treatment apparatus 100 (e-beam apparatus 100) that is fabricated in accordance with one or more embodiments of the present invention. Such an e-beam treatment apparatus is available from Applied Materials, Inc. of Santa Clara, Calif. As shown in FIG. 1, e-beam apparatus 100 includes array 101 of quartz halogen lamps for heating a substrate or a wafer, which array is surrounded by lamp heat shield 157 to provide substantial temperature uniformity across a wafer.

As further shown schematically in FIG. 1, substrate 125 is held over array 101 of lamps by pins 147, for example and without limitation, three (3) pins. In addition, such pins may include one or more thermocouples (not shown) to enable the temperature of substrate 125 to be monitored and controlled in accordance with any one of a number of mechanisms that are well known to those of ordinary skill in the art, for example and without limitation, using a chamber controller. In further addition, one of such pins may include a conductor to enable substrate 125 to be grounded. Pins 147 may be raised or lowered in a conventional matter, for example and without limitation, utilizing a lift plate assembly (not shown) to enable a conventional wafer transport robot and blade structure to move substrate 125 into and out of e-beam treatment apparatus 100.

Apparatus 100 is a type of e-beam apparatus like that disclosed in U.S. Pat. No. 5,003,178 (the '178 patent). Apparatus 100 utilizes various gases and operates at various values of cathode voltage, gas pressure, and working distance (i.e., a distance between the cathode and anode in a generation and acceleration region of the electron beam treatment apparatus, to be described below). As will be described below, such gases and appropriate values of cathode voltage, gas pressure, and working distance may be determined readily by one of ordinary skill in the art without undue experimentation. Co-pending patent application entitled "Improved Large Area Source for Uniform Electron Beam Generation" filed Nov. 21, 2002, Ser. No. 10/301,508 (which co-pending patent application and the present patent application are commonly assigned) and the '178 patent are incorporated by reference herein.

As shown in FIG. 1, e-beam treatment apparatus 100 includes vacuum chamber 120; large-area cathode 122 (for example, and without limitation, a cathode having an area in a range from about 4 square inches to about 700 square inches); and anode 126. As further shown in FIG. 1, anode 126 is disposed between substrate 125 (located in ionization region 138) and cathode 122. Anode 126 is disposed at a working distance from cathode 122 that is determined in a manner to be described below.

As further shown in FIG. 1, electron source 100 further includes: (a) high-voltage insulator 124 that is disposed between cathode 122 and anode 126 and is operative to isolate cathode 122 from anode 126; (b) cathode cover insulator 128 that is located outside vacuum chamber 120 to provide electrical protection for users; (c) valved gas manifold 127 that has an inlet which is fabricated in accordance with any one of a number of methods that are well known to those of ordinary skill in the art to provide a mechanism for admitting gas into vacuum chamber 120 at one or more various input rates from gas source 107; (d) valve controller 133 that operates in response to signals from pressure sensor 137 and real time chamber controller 140 in a manner to be described below; (e) throttle valve 132 that operates in response to a signal from throttle valve controller 133 to control exhaust from vacuum chamber 120; (f) vacuum pump 135 (vacuum pump 135 may be any one or a number of commercially available vacuum pumps capable of pumping vacuum chamber 120 from atmospheric pressure to a pressure in a range between about 1 mTorr to about 200 mTorr such as, for example and without limitation, a turbo pump) that exhausts gas from chamber 120 through throttle valve 132 to control pressure inside vacuum chamber 120; (g) variable, high-voltage power supply 129 that is connected to cathode 122, and which supplies a signal to throttle valve controller 133 that provides a measure of e-beam current impinging upon substrate 125; and (h) variable, low-voltage power supply 131 that is connected to anode 126.

As shown in FIG. 1, a high voltage (for example, a negative voltage between about −500 V and about −30 KV or higher) is applied to cathode 122 from variable, high-voltage power supply 129. In accordance with one embodiment of e-beam apparatus 100, high-voltage power supply 129 may be a Bertan Model #105-30R power supply manufactured by Bertan of Hicksville, N.Y., or a Spellman Model #SL30N-1200X 258 power supply manufactured by Spellman High Voltage Electronics Corp. of Hauppage, N.Y. Variable, low-voltage power supply 131 (for example, a d.c. power supply capable of sourcing or sinking current) is utilized to apply a voltage to anode 126 that is positive relative to the voltage applied to cathode 122. For example, the voltage applied to anode 126 may range from about 0 V to about −500 V. In accordance with one embodiment of e-beam apparatus 100, low-voltage power supply 131 may be an Acopian Model #150PT12 power supply available from Acopian of Easton, Pa.

A wafer or substrate to be treated, such as substrate 125, is placed on pins 147. In accordance with one or more embodiments of e-beam apparatus 100, substrate 125 may be heated during treatment by one or more infrared lamps such as array 101 of quartz halogen lamps disposed to heat substrate 125 in accordance with any one of a number of methods that are well known to those of ordinary skill in the art. Some of the radiation output from such lamps may be reflected within chamber 120 to anode 126. Accordingly, in accordance with one or more such embodiments of e-beam apparatus 100, an internal portion of vacuum chamber 120 may be $bead blasted, darkened, roughened, or anodized to reduce the coefficient of reflection of the internal portion of the chamber to be less than about 0.5. In this manner, a portion of the radiation output from the lamps may be absorbed by the internal portion of vacuum chamber 120.

Wafer 125 may be placed at a relatively large distance, such as, for example, and without limitation, 10 to 30 mm, from anode 126 to prevent electrons from casting an image of anode 126 on wafer 125. In addition, irradiation of wafer 125 may further entail sweeping the electron beam back and forth across wafer 125 by using, for example and without limitation, a time-varying magnetic field produced by deflection coils surrounding vacuum chamber 120 as shown in FIG. 3 of the '178 patent.

In accordance with one or more embodiments of e-beam apparatus 100, anode 126 may be fabricated (in whole or a surface thereof) from an electrically conductive material such as, for example, and without limitation, Al, Ti, Ni, Si, Mo, graphite, W, Co, and alloys of the foregoing. For treating films at relatively high temperatures, for example, temperatures in a range between about 200° C. and about 600° C., aluminum may provide a more suitable material than graphite. For example, aluminum generally has a higher thermal conductivity than graphite, and as a consequence, an anode formed from aluminum may bow less at high temperatures than one formed from graphite. In addition, aluminum has a lower emissivity than graphite, and this leads to lower heat transfer to the anode by radiation (for example, from wafer 125). In further addition, aluminum has a lower sputtering yield than graphite, thereby resulting in less contamination on wafer 125. It should be noted that in addition to anode 126 being made from aluminum, cathode 122 and vacuum chamber 122 may also be made from aluminum. However, the surface of cathode 122 may also be fabricated from Al, Ti, Ni, Si, Mo, graphite, W, Co and alloys of the foregoing.

Anode 126 may be, for example, and without limitation, a grid, a mesh or a plate having an array of holes disposed therethrough. For example, in accordance with one or more embodiments of e-beam apparatus 100, the size of the holes may be varied to compensate for a decrease in beam intensity that sometimes occurs at an edge of anode 126. In this manner, a more diametrically uniform electron beam may be generated. For example, in accordance with one or more embodiments of e-beam apparatus 100, anode 126 comprises 37,500 holes with four concentric zones of different hole diameter, providing approximately 58% open area. In using such an embodiment, electron beam uniformity may be tuned by hole diameter in each zone, with larger diameter holes disposed at the edge of at anode 126 where the tuning entails using film shrinkage uniformity. Examples for the array of holes and methods for making the holes are described in more detail in U.S. Pat. No. 6,407,399 which patent is incorporated by reference herein.

In some applications, it is desirable to provide constant electron beam current during treatment. The electron beam current may vary because, among other things, processing may cause deposition of outgassed treatment by-products on chamber walls, the anode, and the cathode, and this may reduce electron generation efficiency.

Apparatus 100 shown in FIG. 1 may provide constant electron beam current during treatment as follows: (a) high voltage power supply 129 and low voltage power supply 131 are set to predetermined output voltage values for a particular application (typically, the voltages are set in response to input from real time chamber controller 140 in a conventional manner); (b) valved gas manifold 127 is set to provide a predetermined value of gas flow for a particular application (typically, the setting of a valve is set in response to input from real time chamber controller 140 in a conventional manner); (c) throttle valve controller 133 sends a signal to throttle valve 132 to cause it to provide a predetermined gas pressure in vacuum chamber 120 for a particular application (typically, throttle valve controller 133 operates in response to input from real time chamber controller 140 in a conventional manner); (d) real time controller 140 sends a signal to throttle valve controller 133 that represents a "current set point" for a particular application; (e) high voltage power supply 129 sends a signal to throttle valve controller 133 that represents a measure of electron beam current; and (f) throttle valve controller 133 causes the measure of electron beam current to match the "current set point" by sending signals to throttle valve 132 to open it or close it to control chamber pressure so as to maintain constant beam current. For example and without limitation, in accordance with one embodiment of apparatus 100, throttle valve 132 has a response time for opening or closing of about 130 ms. Typically, as a chamber gets dirty, the efficiency of electron production goes down, and to counteract this, the chamber pressure is increased to provide a constant electron beam. In accordance with one or more embodiments, the measure of electron beam current is determined by estimating that, for example and without limitation, a predetermined number of electrons produced at cathode 122 do not travel through anode 126 (for example, anode 126 may include a pattern of holes that transmits only ~60% of the electrons impinging thereon from cathode 122), and by estimating that a predetermined number of electrons (for example and without limitation, 10%) transmitted through anode 126 do not strike substrate 125 because the area anode 126 may be larger (for example and without limitation, 10% larger) than the area of substrate 125. As such, in accordance with one or more embodiments, the measure of electron beam current is determined by estimating that ~40% of the electrons leaving cathode 122 (measured by high voltage power supply 129) reach substrate 125. Such estimates may be experimentally verified by measurements utilizing graphite wafers or by measurements utilizing a Faraday cup in accordance with any one of a number of methods that are well known to those of ordinary skill in the art.

In some applications, it may be desirable to provide constant beam current at different electron beam energies. For example it may be desirable to treat an upper layer of a film formed on a substrate, but not a bottom layer. This may be accomplished by utilizing an electron beam whose energy is low enough so that most of the electrons in the beam are absorbed in the upper layer. Subsequent to treating the upper layer, it may be desirable to treat lower layers of the film. This may be done by raising the accelerating voltage of the electron beam, i.e., the cathode voltage, to enable it to penetrate completely through the film.

Figure 2:
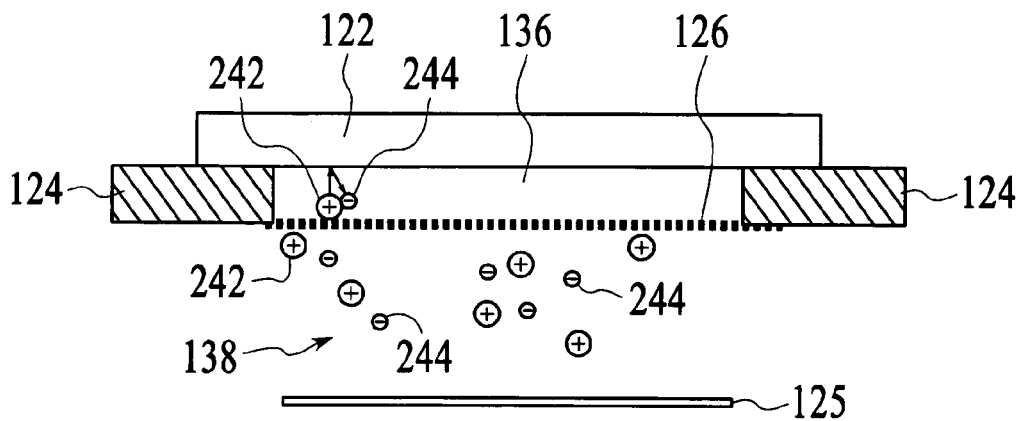
FIG. 2 shows a fragmentary view of the electron beam treatment apparatus of FIG. 1 which helps to illustrate some details of its operation.

FIG. 2 shows a fragmentary view of electron beam treatment apparatus 100 of FIG. 1 that helps to illustrate some details of its operation. To initiate electron emission in electron beam treatment apparatus 100, gas in ionization region 138 between anode 126 and wafer 125 must become ionized. In accordance with one or more embodiments of the present invention, the gas may include one or more of, for example, and without limitation, helium, argon, nitrogen, hydrogen, oxygen, ammonia, neon, krypton, and xenon. The step of ionizing the gas may be initiated by naturally occurring gamma rays, or it may be initiated by a high voltage spark gap disposed inside vacuum chamber 120 in accordance with any one of a number of methods that are well known to those of ordinary skill in the art.

Anode 126 is negatively biased by a voltage in a range, for example, from about 0 V to about −500 V that is applied thereto from low-voltage power supply 131. Once ionization is initialized, as shown in FIG. 2, positive ions 242 are attracted toward negatively biased anode 126. These positive ions 242 pass through holes in anode 126 into electron generation and acceleration region 136 between cathode 122 and anode 26. In region 136, positive ions 242 are accelerated toward cathode 122 as a result of a voltage (for example, a voltage in a range from about −500 V to about −30 KV or higher) that is applied thereto from high-voltage power supply 129. Upon striking the surface of cathode 122, positive ions 242 produce electrons 244 that are accelerated back toward anode 126. Some of electrons 244 strike anode 126, but many pass through anode 126, and continue on to impinge upon wafer 125. In addition, some of electrons 244 ionize gas molecules in ionization region 138.

The working distance between cathode 122 and anode 126 may be set to any value that is consistent with obtaining no arcing or breakdown in generation and acceleration region 136. This enables the presence of ions in generation and acceleration region 136 to be controlled by voltage applied to anode 126. In turn, this enables electron emission, and hence, electron beam current, to be controlled continuously from small currents to large currents by varying the voltage applied to anode 126. In addition, electron emission, and hence, electron beam current, can also be controlled by using throttle valve 132 to adjust the gas pressure in vacuum chamber 120 (i.e., raising or lowering gas pressure, raises or lowers, respectively, the number of molecules in ionization region 138 and generation and acceleration region 136). As a result, in operation, one can utilize: (a) values of cathode voltage that are small enough to be useful in treating thin films; (b) values of gas pressure that are high enough to sustain electron beam current at such small values of cathode voltage; and (c) values of working distance that provide sufficient working tolerances to mitigate, for example, and without limitation, mechanical problems that might be caused by heating of chamber elements such as anode 126.

One can determine appropriate values of operation by routine experimentation as follows. First, chose a convenient working distance for the electron beam treatment apparatus. Next, select a value of cathode voltage that is determined by the energy of electrons required to treat a wafer. Next, while measuring the electron beam current (using, for example, a current detector disposed in series with high-voltage power supply 129), vary the gas pressure to sustain an effective, uniform electron beam. The current is measured to determine values of current that provide useful throughput (for example, and without limitation, electron beam current may range from about 1 mA to about 40 mA), and to ensure that the values of cathode voltage, gas pressure, and working distance used do not result in arcing or breakdown in generation and acceleration region 138 (breakdown may be evidenced by a faint plasma or arcing which can also be observed by voltage or current spiking at the cathode).

As shown in FIG. 1, array of lamps 101 irradiate and heat wafer or substrate 125, thereby controlling its temperature. Since wafer 125 is in a vacuum environment, and is thermally isolated, wafer 125 can be heated or cooled by radiation. If the lamps are extinguished, wafer 125 will radiate away its heat to the surrounding surfaces and gently cool. Wafer 125 is simultaneously heated by the lamps and irradiated by the electron beam throughout the entire process. For example, in accordance with one embodiment, array 101 of infrared quartz halogen lamps are on continuously until the temperature of wafer 125 reaches a process operating temperature. The lamps are thereafter turned off and on at a predetermined, and perhaps, varying duty cycle to control the wafer temperature.

Figure 3A:
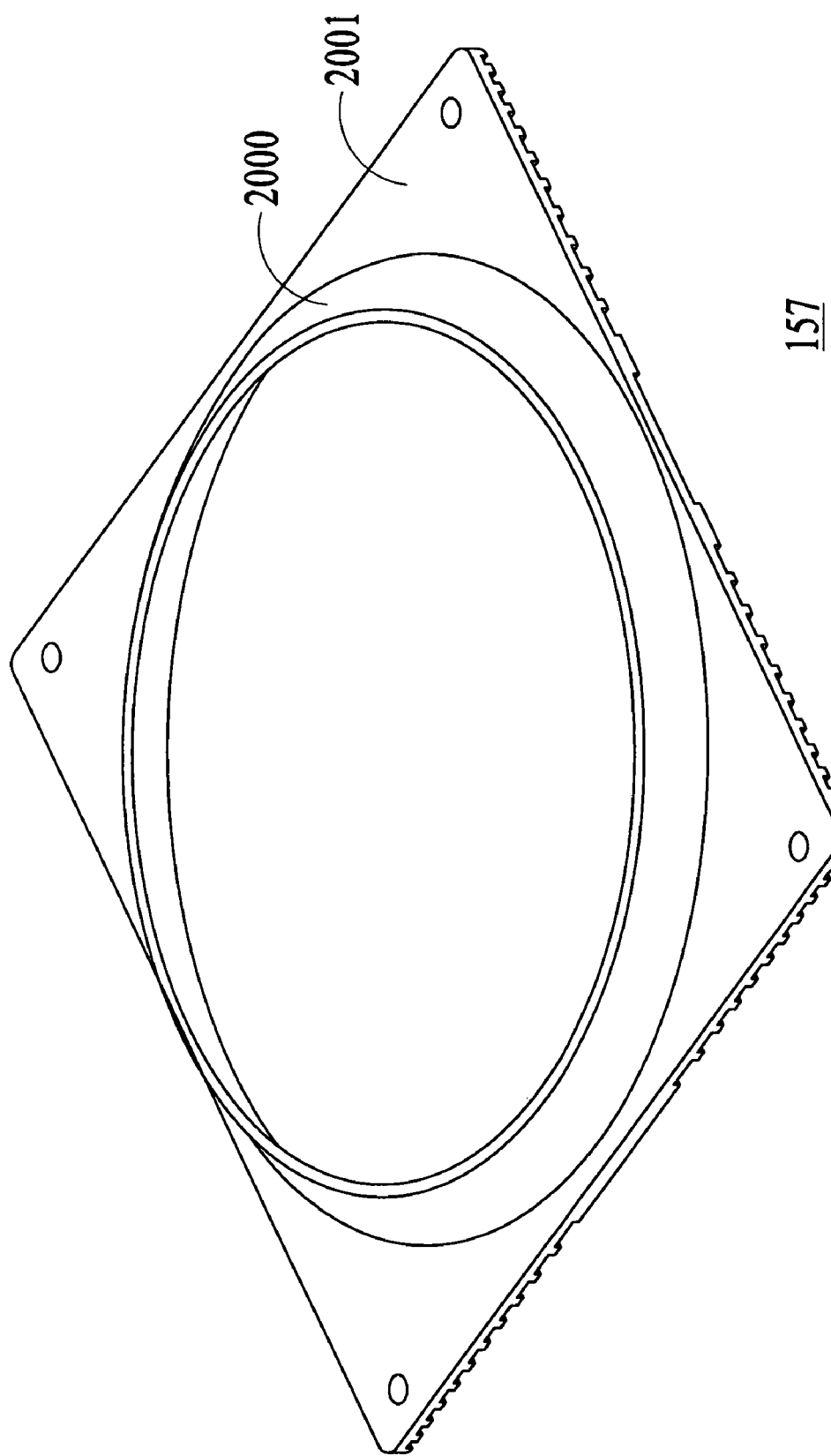
FIGS. 3A and 3B show a top perspective view and a bottom perspective view, respectively, of a lamp heat shield for the electron beam treatment apparatus shown in FIG. 1, which lamp heat shield is fabricated in accordance with one or more embodiments of the present invention.
Figure 3B:
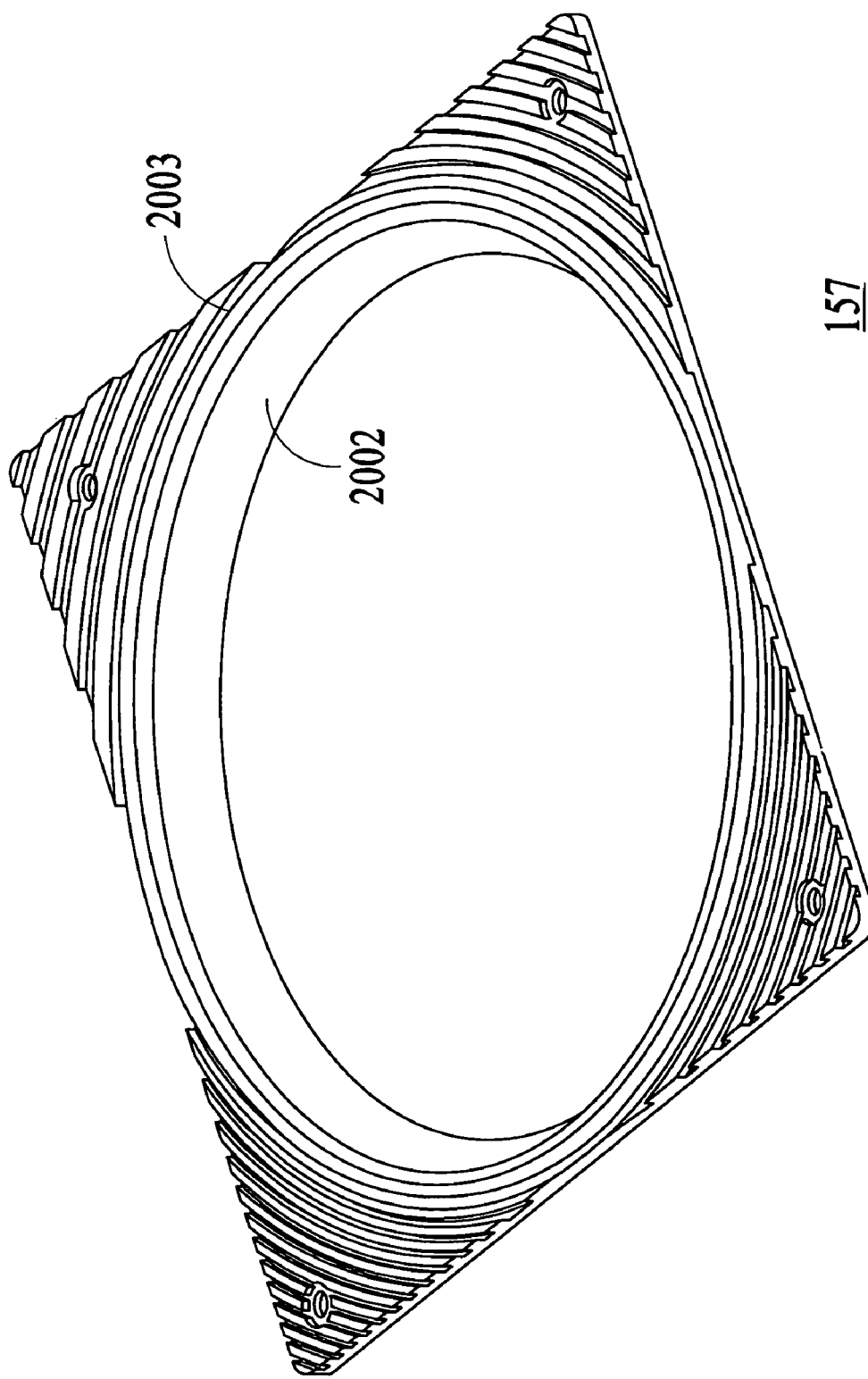

FIGS. 3A and 3B show a top perspective view and a bottom perspective view, respectively, of lamp heat shield 157 of electron beam treatment apparatus 100, which lamp heat shield 157 is fabricated in accordance with one or more embodiments of the present invention. As shown in FIG. 3A, lamp heat shield 157 comprises truncated cone section 2000 and planar section 2001. As will be described below, wafer 125 is located within truncated cone section 2000 when it is treated by an electron beam.

Lamp heat shield 157 is fabricated from aluminum, and as indicated by FIG. 3B, inside surface 2002 of truncated cone section 2000 is substantially smooth. In particular, in accordance with one or more embodiments of the present invention, inside surface 2002 is polished to provide high reflectivity, for example and without limitation, it is polished to a mirror-like condition to enable it to reflect infrared radiation from the quartz halogen lamps of array 101 towards wafer 125 to provide good wafer-center-to-edge temperature uniformity. The particular angle that inside surface 2002 makes with a perpendicular to a plane through inside surface 2003, and the particular reflectivity of inside surface 2002 may determined routinely by one of ordinary skill in the art without undue experimentation. For example, in accordance with one embodiment of the present invention, the angle is about 50°, and the reflectivity is about 90%.

As further shown in FIG. 3B, in accordance with one or more embodiments of the present invention, to enhance heating of lamp heat shield 157, inside surface 2003 of planar section 2001 has circular grooves formed therein (for example and without limitation, such grooves can be fabricated by milling grooves on a lathe) to increase the surface area for absorption of radiation from the quartz halogen lamps of array 101. In addition, in accordance with one or more further embodiments of the present invention, inside surface 2003 is treated to reduce its coefficient of reflection for radiation from quartz halogen lamps of array 101. For example and without limitation, inside surface 2003 may be bead blasted, darkened, roughened or anodized to reduce its coefficient of reflection. Although the grooves in inside surface 2003 are shown to be circular, embodiments of the present invention are thusly limited, and further embodiments of the present invention may be fabricated wherein the grooves may have any one of a number of different configurations such as, for example and without limitation, straight-lined grooves disposed at any one of a number of angles, or sets of straight-line grooves disposed at a multiplicity of angles with respect one another. In addition, the number of grooves is not limited to any specific number, however, it is believed that a larger number of grooves may provide better absorption of radiation. In further addition, a cross section of the grooves is not limited to any specific shape, the depth of the grooves is not limited to any specific depth, and a spacing between the grooves is not limited to any specific spacing. Appropriate cross sections, depths, spacings, and configurations of grooves may be determined routinely by one of ordinary skill in the art without undue experimentation. For example, in accordance with one embodiment of the present invention, the cross section of a groove is a rectangle, the depth of a groove is about 0.093", the width of a groove is about 0.125", and number of grooves per inch is 4.

Although lamp heat shield 157 shown in FIGS. 3A and 3B is fabricated from aluminum, embodiments of the present invention are not thusly limited, and further embodiments of the present invention may be fabricated wherein lamp heat shield 157 may be fabricated using a large number of materials. For example and without limitation, lamp heat shield 157 may be fabricated utilizing metals such as, for example and without limitation, aluminum and stainless steel, ceramics such as, for example and without limitation, alumina ($Al_2O_3$) and aluminum nitride, ceramics having metal layers disposed on at least portions thereof, quartz having metal layers disposed on at least portions thereof, and combinations of the foregoing.

Figure 4:
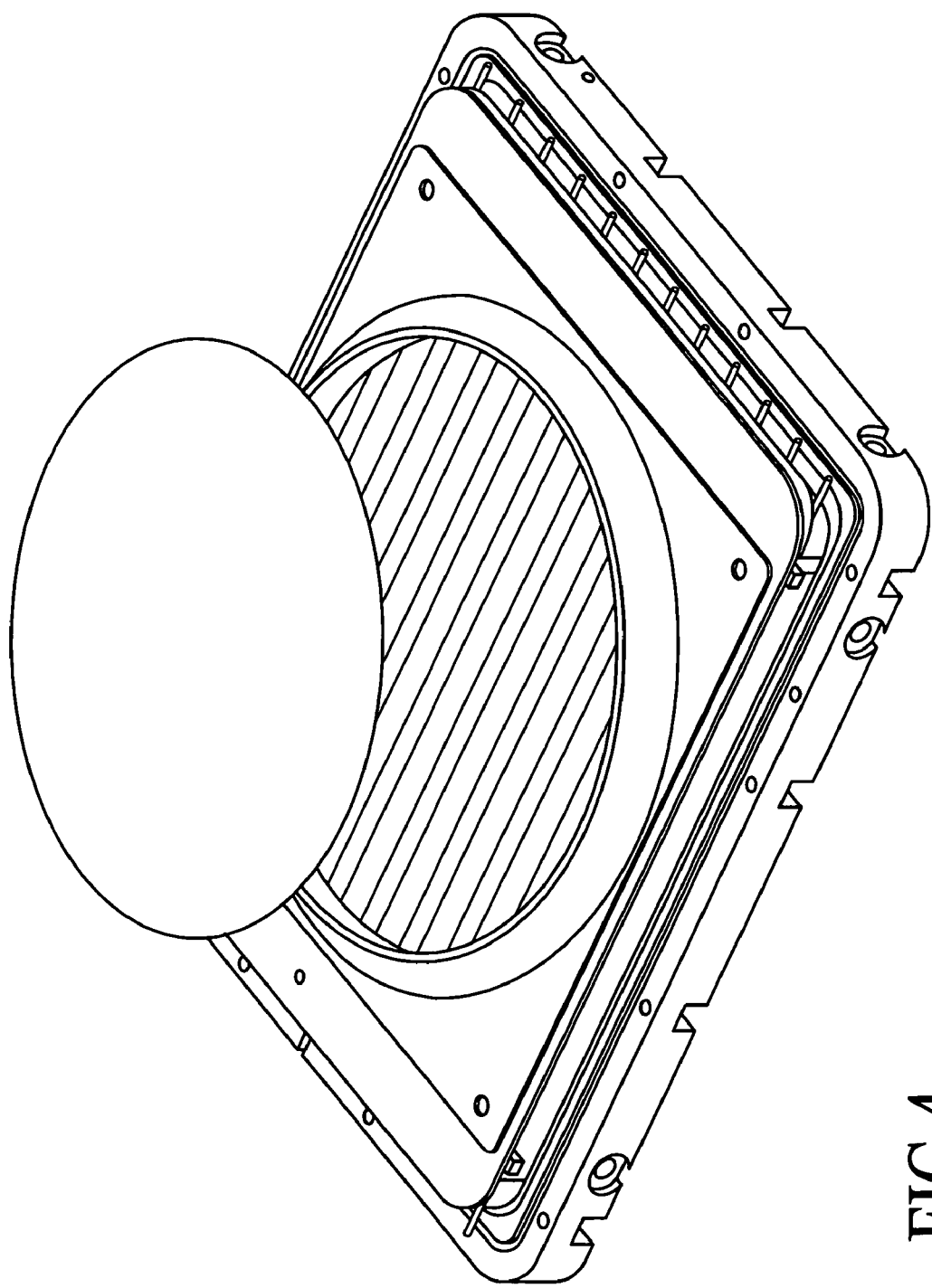
FIG. 4 shows a top perspective view of the lamp heat shield shown in FIGS. 3A and 3B as installed in the electron beam treatment apparatus of FIG. 1 with a wafer held above the lamp heat shield.

FIG. 4 shows a top perspective view of lamp heat shield 157 shown in FIGS. 3A and 3B as installed in electron beam treatment apparatus 100 with wafer 125 being held above lamp heat shield 157 by pins 147 (not shown in FIG. 4). As such, FIG. 4 shows wafer 125 as it is located prior to being lowered into position for treatment by pins 147 (not shown in FIG. 4). In accordance with one or more embodiments of the present invention, the height of truncated cone section 2001 (along a perpendicular to the plane of planar section 2001) is as high as possible while being bounded by the condition that a robot arm be able to move wafer 125 into and out of chamber 120 without interference from lamp heat shield 157, for example and without limitation, 0.75". As shown in FIG. 4, array 1001 of quartz halogen lamps is disposed below lamp heat shield 157.

Figure 5:
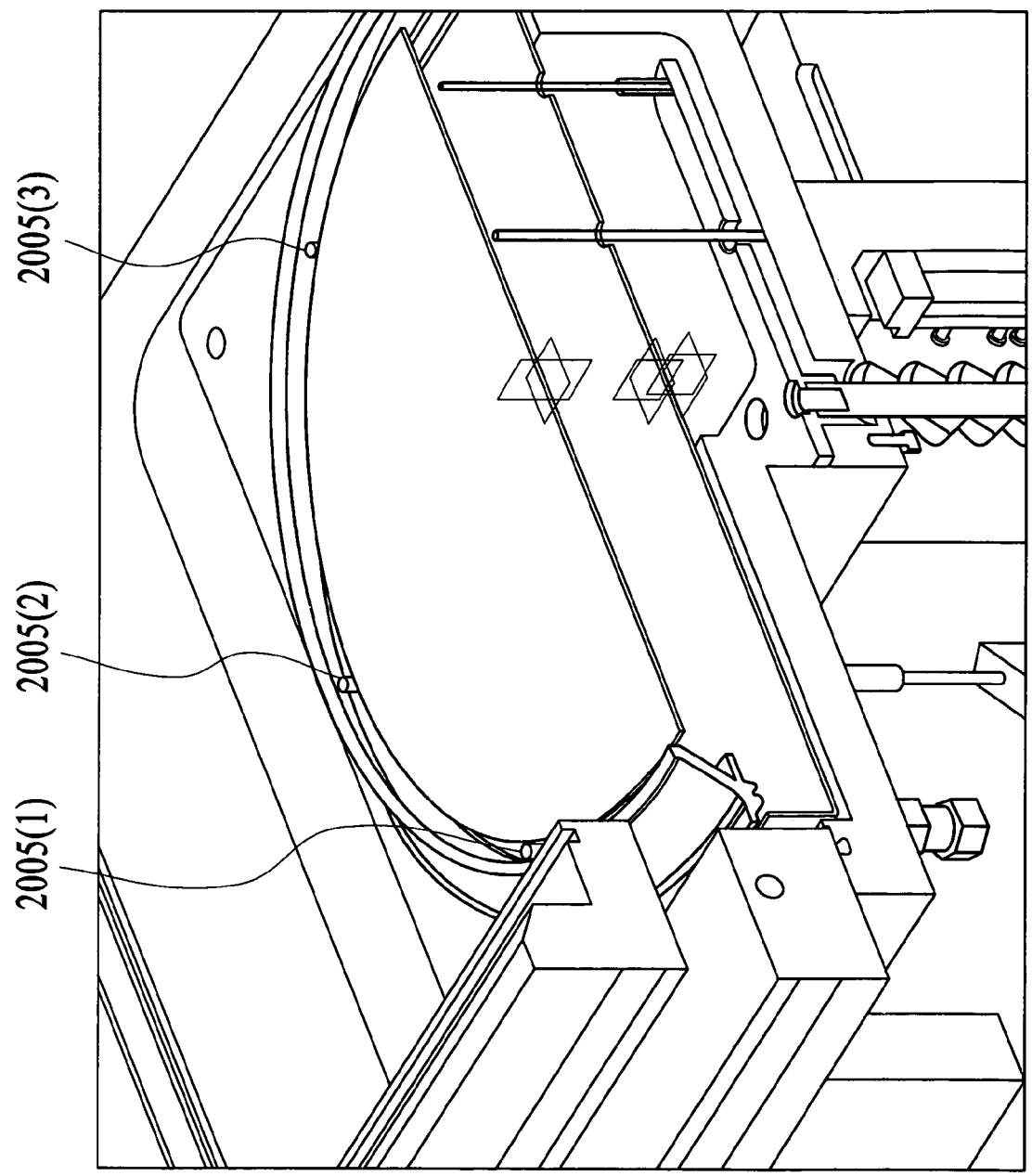
FIG. 5 shows a top perspective view of the lamp heat shield shown in FIGS. 3A and 3B as installed in the electron beam treatment apparatus of FIG. 1 with a wafer held in position for treatment.

FIG. 5 shows a top perspective view of lamp heat shield 157 shown in FIGS. 3A and 3B as installed in an electron beam treatment apparatus 100 with wafer 125 being held in position for treatment by pins 147. In accordance with one embodiment of the present invention, when wafer 125 is disposed in position for treatment, it is about 1.25" above the center of the quartz lamps of array 101, wherein the quartz lamps have a diameter of about 0.382". As such, wafer 125 is disposed at about ½ the height of truncated cone 2000 along a perpendicular to the plane of planar section 2001. Also shown in FIG. 5, are pins 2005₁–2005₃ which serve to center wafer 125 within truncated cone 2000 of lamp heat shield 157. Advantageously, such an embodiment of the present invention is able to provide temperature uniformity across a wafer or substrate of about ±4° C.

Although the above-described embodiments described holding or supporting a wafer or substrate utilizing pins, further embodiments exist wherein the wafer or substrate may be held or supported utilizing any one of a number of support mechanisms that well known to those of ordinary skill in the art. For example and without limitation, the wafer or substrate may be held or supported utilizing a ring or other structure that passes radiation to an underside of the wafer or substrate, the wafer or substrate may be held or supported utilizing a plate structure that may be transparent to radiation from the lamps or non-transparent to radiation from the lamps.

Those skilled in the art will recognize that the foregoing description has been presented for the sake of illustration and description only. As such, it is not intended to be exhaustive or to limit the invention to the precise form disclosed.

What is claimed is:

1. An electron beam treatment apparatus that includes:
   an array of lamps that output radiation;
   a support mechanism adapted to support a substrate at a treatment position above the lamps; and
   a lamp heat shield, disposed above the array, having a radiation absorption portion adapted to absorb radiation from at least a portion of the array, and a radiation reflection portion adapted to reflect radiation from at least a portion of the array towards the substrate when disposed at the treatment position.

2. The apparatus of claim 1 wherein the radiation absorption portion is planar and is disposed substantially parallel to a plane of the substrate when disposed at the treatment position.

3. The apparatus of claim 2 wherein a reflecting surface of the radiation reflection portion is positioned to reflect radiation and is disposed at an angle with respect to a perpendicular to the plane of the radiation adsorption portion.

4. The apparatus of claim 3 wherein an absorbing surface of the radiation absorption portion is positioned to absorb radiation and has grooves formed therein.

5. The apparatus of claim 4 wherein the absorbing surface is bead blasted.

6. The apparatus of claim 5 wherein the grooves are circular grooves.

7. The apparatus of claim 3 wherein the reflecting surface has a mirror-like finish.

8. The apparatus of claim 1 wherein the lamp shield is fabricated from aluminum.

9. The apparatus of claim 1 wherein the lamp shield is fabricated from one or more of a metal, quartz, and ceramic.

10. The apparatus of claim 3 wherein the angle is about 50°.

11. The apparatus of claim 3 wherein the reflecting surface has a reflectivity of about 90%.

12. A lamp heat shield useful in an electron beam treatment apparatus which comprises:
    a radiation absorption portion adapted to absorb radiation from at least a portion of an array of lamps disposed below the shield; and
    a radiation reflection portion adapted to reflect radiation from at least a portion of the array towards an object disposed within the radiation reflection portion.

* * * * *